United States Patent
Cho et al.

(10) Patent No.: US 8,120,419 B2
(45) Date of Patent: Feb. 21, 2012

(54) APPARATUS FOR TYPE-A DEMODULATION AND INTEGRATED CIRCUIT CARD INCLUDING THE SAME

(75) Inventors: Jong Pil Cho, Hwasung-si (KR); Hyuk Jun Sung, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 154 days.

(21) Appl. No.: 12/722,812

(22) Filed: Mar. 12, 2010

(65) Prior Publication Data
US 2010/0231293 A1 Sep. 16, 2010

(30) Foreign Application Priority Data

Mar. 13, 2009 (KR) .................. 10-2009-0021586

(51) Int. Cl.
- H03D 1/00 (2006.01)
- H03D 1/02 (2006.01)
- H03D 1/06 (2006.01)
- H03D 3/00 (2006.01)
- H03D 5/00 (2006.01)
- H03K 9/00 (2006.01)
- H04B 1/16 (2006.01)
- H04B 1/18 (2006.01)
- H04L 27/00 (2006.01)

(52) U.S. Cl. ........ 329/349; 329/311; 329/318; 375/316; 455/280; 455/337

(58) Field of Classification Search .................. 329/311, 329/315, 318, 347, 349, 372; 375/316, 346; 455/39, 130, 269, 280, 283, 296, 334, 337
See application file for complete search history.

(56) References Cited

U.S. PATENT DOCUMENTS

| 5,345,231 | A | 9/1994 | Koo et al. |
| 6,595,414 | B1 | 7/2003 | Eber et al. |
| 6,907,088 | B1 | 6/2005 | Nakane et al. |
| 2003/0226082 | A1* | 12/2003 | Kim et al. ..................... 714/734 |

* cited by examiner

*Primary Examiner* — David Mis
(74) *Attorney, Agent, or Firm* — F. Chau & Associates, LLC

(57) ABSTRACT

A type-A demodulator comprising a first rectifier configured to rectify a radio frequency (RF) signal received through an antenna and output a first voltage, a second rectifier configured to rectify the voltage of the RF signal received through the antenna and output a second voltage having a different voltage level than the first voltage, and a pause data detector configured to compare the first voltage with the second voltage and detect received pause data.

20 Claims, 7 Drawing Sheets

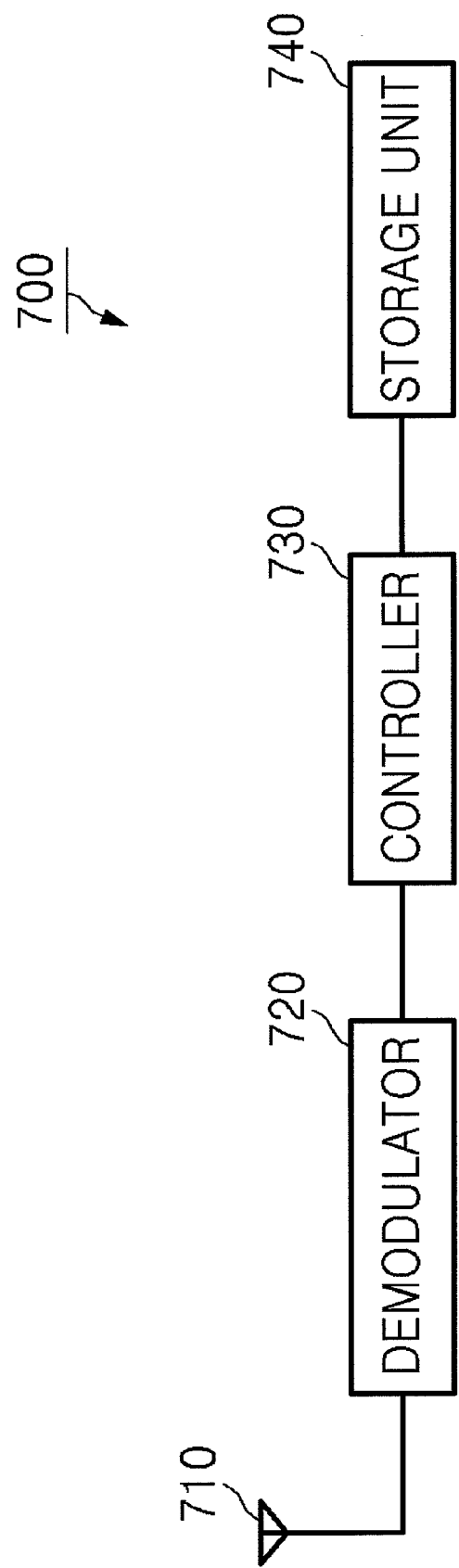

APPARATUS FOR TYPE-A DEMODULATION AND INTEGRATED CIRCUIT CARD INCLUDING THE SAME

CROSS-REFERENCE TO RELATED APPLICATIONS

This application claims priority under 35 U.S.C. §119(e) to Korean Patent Application No. 10-2009-0021586 filed on Mar. 13, 2009, in the Korean Intellectual Property Office, the disclosure of which is incorporated by reference herein in its entirety.

BACKGROUND

The inventive concept relates to wireless communication, and more particularly, to an apparatus for type-A demodulation, which prevents distortion caused by the distance from a transmitter to a receiver and the communication speed in type-A communication, and an integrated circuit (IC) card including the same.

Radio frequency identification (RFID) is a core technology that is ubiquitous in today's society. RFID is used in various fields, such as national defense, medical care, distribution systems, transportation systems, security systems, manufacturing systems and administration systems. An RFID system including a tag, a reader, and an antenna is a wireless, automatic identification system which receives information from a tag attached to an object or a product using the reader and transmits the information to a network. RFID uses different frequency band in various applications. For example, 125 kHz passive RFID is used for access control, security systems, and animal management; 13.56 MHz passive RFID is used for transport cards, warehousing operations, and distribution of goods; 433 MHz RFID is used for container monitoring and tire pressures sensors; and 900 MHz passive RFID is used for logistics. Of these frequencies, 13.56 MHz passive RFID, also referred to as type-A mode, is most widely used. In the type-A mode, a radio frequency (RF) signal is transferred with modified Miller coding from a transmitter to a receiver or from a reader to a tag or card. An apparatus used in the type-A mode is a type-A demodulator. The type-A demodulator detects a pause in the transmission of the RF signal.

Conventional type-A demodulators may fail if the pause section changes or goes undetected as a result of the distance between a transmitter and a receiver or a reader and a tag or card. Changes in the external environment may also cause type-A demodulators to malfunction.

SUMMARY

Some exemplary embodiments of the inventive concept provide an apparatus for type-A demodulation, which efficiently detects a type-A pause signal without distortion regardless of the change in the distance between a transmitter and a receiver, and an integrated circuit (IC) card including the same.

Some exemplary embodiments of the inventive concept also provide an apparatus for type-A demodulation, which efficiently detects a type-A pause signal without distortion regardless of communication speed, and an IC card including the same.

According to an exemplary embodiment of the inventive concept, there is provided a type-A demodulator. The type-A demodulator includes a first rectifier configured to rectify a radio frequency (RF) signal received through an antenna and output a first voltage, a second rectifier configured to rectify the RF signal received through the antenna and output a second voltage having a different voltage level than the first voltage, and a pause data detector configured to compare the first voltage with the second voltage and to detect received pause data.

The apparatus may further include a first charge storage device connected to the first rectifier and a second charge storage device connected to the second rectifier and having less capacitance than the first charge storage device. The capacitance of each of the first and second charge storage devices may be set variably.

The first rectifier may include a first diode string including a plurality of diodes and the second rectifier may include a second diode string including a less number of diodes than the first diode string.

The pause data detector may include a comparator configured to receive the first voltage and the second voltage as a positive input voltage and a negative input voltage, respectively, and detect a pause period based on a first voltage crossing between the first and second voltages occurring when the pause period starts and a second voltage crossing between the first and second voltages occurring when the pause period ends.

The type-A demodulator may further include a filter configured to eliminate noise on an output of the comparator. The filter may comprise a Schmitt trigger having a hysteresis characteristic.

The type-A demodulator may further include a first current controller configured to induce a voltage drop of the first voltage and a second current controller configured to induce a voltage drop of the second voltage. The current value of each of the first and second current controllers may be set variably.

The first and second charge storage devices of the type-A demodulator may comprise a capacitor.

The voltage difference between the first voltage and the second voltage of the type-A demodulator may remain constant.

The first and second rectifiers of the type-A demodulator may further comprise a level converter.

The comparator of the type-A demodulator may generate an output at a high level during a non-pause period and an output at a low level during a pause period.

The comparator of the type-A demodulator may determine that the pause period has started upon the first voltage decreasing by at least a predetermined level below the second voltage, and determine that the pause period has ended upon the first voltage increasing by at least a predetermined level above the second voltage.

According to other embodiments of the inventive concept, there is provided an IC card including an antenna configured to receive an RF signal from a transmitter; a demodulator configured to rectify the RF signal through two rectifiers, output a first voltage and a second voltage, respectively having different voltage levels, detect a pause period based on a first and second voltage crossing between the first and second voltages, wherein the first voltage crossing occurs when the pause period starts and the second voltage crossing occurs when the pause period ends, and output received pause data; a storage unit configured to store the received pause data; and a controller configured to control the antenna to receive the RF signal, the demodulator to perform demodulation, and the storage unit to store the pause data.

The demodulator may eliminate noise from the pause period using filtering having a hysteresis characteristic and then output the pause period as the received pause data.

The storage unit may comprise at least one of a volatile memory and a non-volatile memory.

According to further embodiments of the inventive concept, there is provided a type-A demodulation method including rectifying an RF signal received through an antenna to a first voltage and a second voltage respectively having different voltage levels; and detecting a pause period in the RF signal based on a first and second voltage crossing between the first voltage and the second voltage, wherein the first voltage crossing corresponds to a start of the pause period and the second voltage crossing corresponds to an end of the pause period.

The method may further include eliminating noise from the pause period using filtering having a hysteresis characteristic and then outputting the pause period as received pause data.

The method may further include the voltage of the RF signal being rectified through two diode string paths, respectively including a different number of diodes.

BRIEF DESCRIPTION OF THE DRAWINGS

The above and other features and advantages of the inventive concept will become more apparent by describing in detail exemplary embodiments thereof with reference to the attached drawings in which:

FIG. 7 is a block diagram of an integrated circuit (IC) card according to an exemplary embodiment of the inventive concept.

DETAILED DESCRIPTION OF THE EMBODIMENTS

Figure 1:
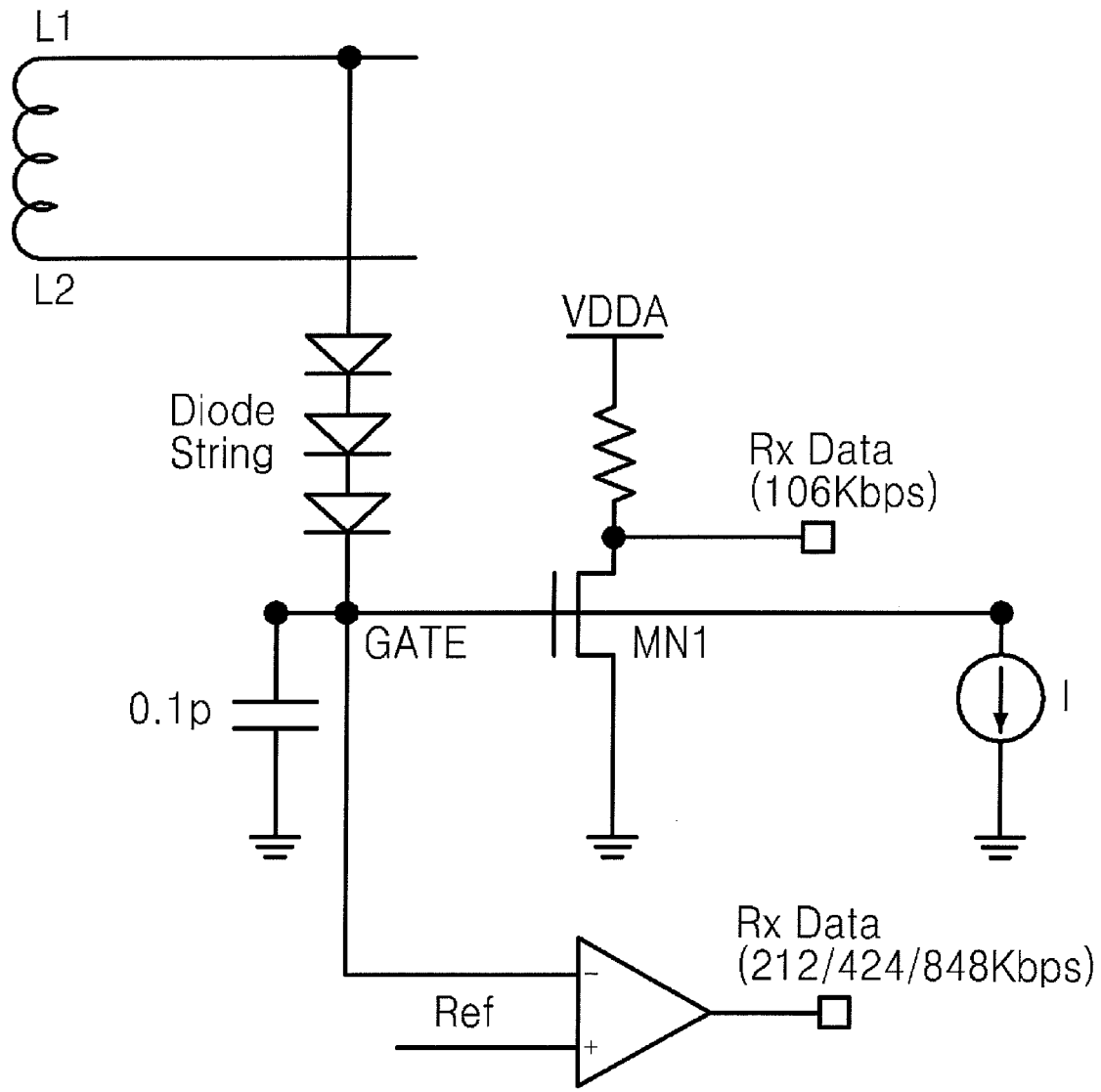
FIG. 1 is a circuit diagram of a type-A demodulator according to prior art.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs.

A type-A demodulator usually drops the voltage of an antenna reception signal using a diode and then inputs the signal to a common source amplifier or compares the signal with a reference voltage to demodulate the signal.

FIG. 1 is a circuit diagram of a type-A demodulator according to prior art. A 13.56 MHz radio frequency (RF) signal is received through an L1/L2 antenna and is constantly rectified and dropped through a diode string. As a result, only a pause signal is envelope-detected at a gate node GATE. In 106 Kbps communication, the pause signal is amplified using a transistor MN1, i.e., a common source amplifier used to perform type-A demodulation. In 212 Kbps communication, the pause signal is compared with a predetermined reference voltage using a comparator to perform type-A demodulation.

In the conventional type-A demodulator shown in FIG. 1, the voltage applied to the L1/L2 antenna varies by about 1 to 2 V depending on the distance between a transmitter and a receiver. Therefore, the voltage at the gate node GATE also varies by about 1 to 2 V. As a result, when demodulation is performed based on the voltage at the gate node GATE, or when the voltage at the gate node GATE is compared with the reference voltage, the pause signal is changed or is not detected at all depending on the distance between the transmitter and the receiver.

According to the ISO14443 standard, a pause signal that has been 100% modulated or has an amplitude of nearly 0 is used in 106 Kbps communication, while a pause signal having an amplitude of 60% or less of the peak amplitude of an RF signal may be used in 212, 424, or 848 Kbps communication. Since the pause signal having 60% of the peak amplitude has a narrow difference between a high voltage and a low voltage at the gate node GATE, it is difficult to compare the pause signal with the reference voltage. Thus, the pause signal detected by a conventional type-A demodulator may be distorted, especially as the communication speed increases to 848 Kbps.

Figure 2:
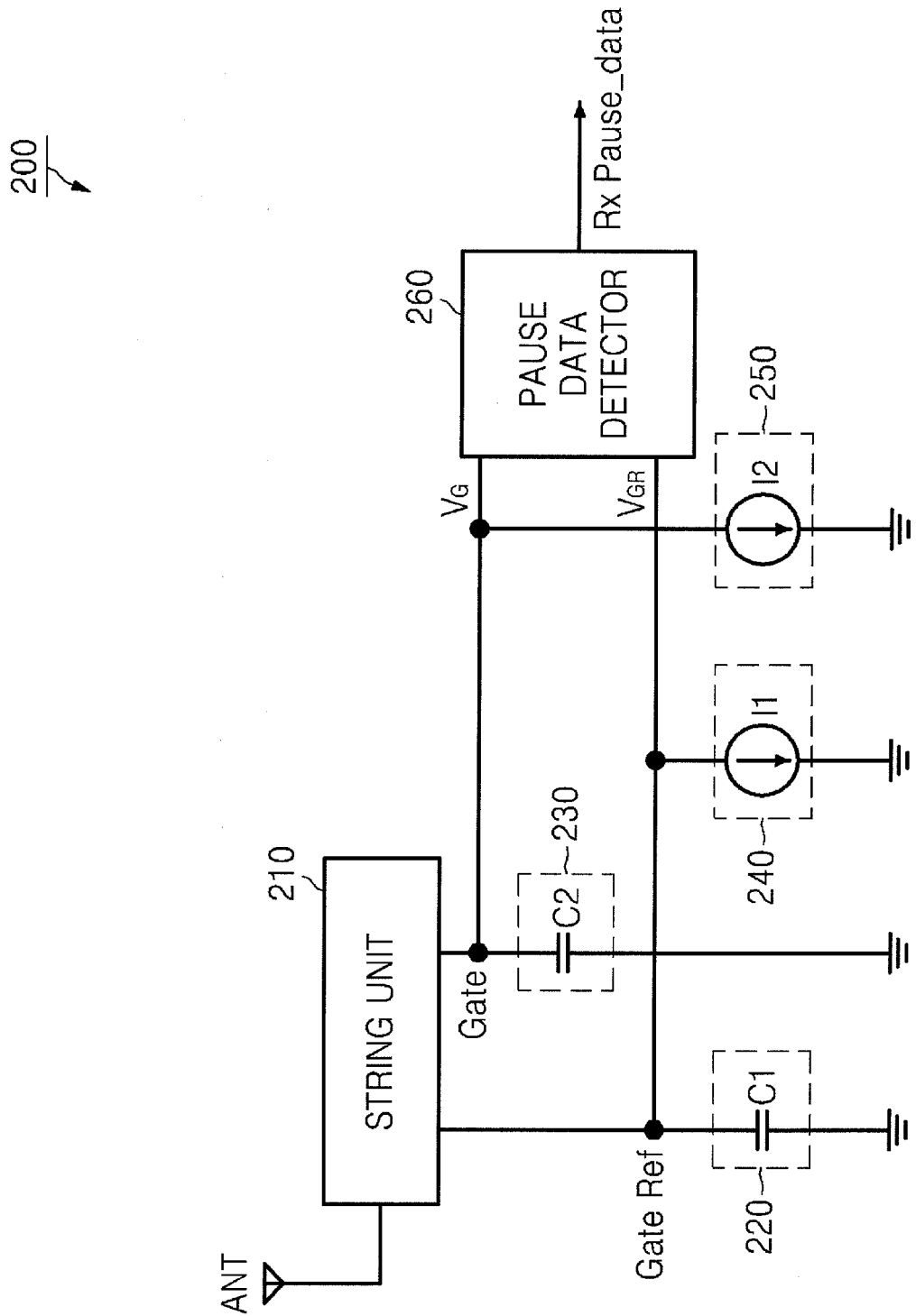
FIG. 2 is a block diagram of an apparatus for type-A demodulation according to an exemplary embodiment of the inventive concept.

FIG. 2 is a block diagram of an apparatus 200 for type-A demodulation, according to an exemplary embodiment of the inventive concept. The apparatus 200 may include a string unit 210, a first charge storage device 220, a second charge storage device 230, a first current controller 240, a second current controller 250, and a pause data detector 260.

The string unit 210 rectifies and drops the voltage of an RF signal received through an antenna ANT through two paths respectively connected to a gate reference node Gate Ref and a gate node Gate. The string unit 210 may include a first path outputting a first voltage and a second path outputting a second voltage having a different voltage level than the first voltage. In an exemplary embodiment, the voltage drop over the path comprising the gate reference node Gate Ref may be greater than the voltage drop over the path comprising the gate node Gate.

Figure 3:
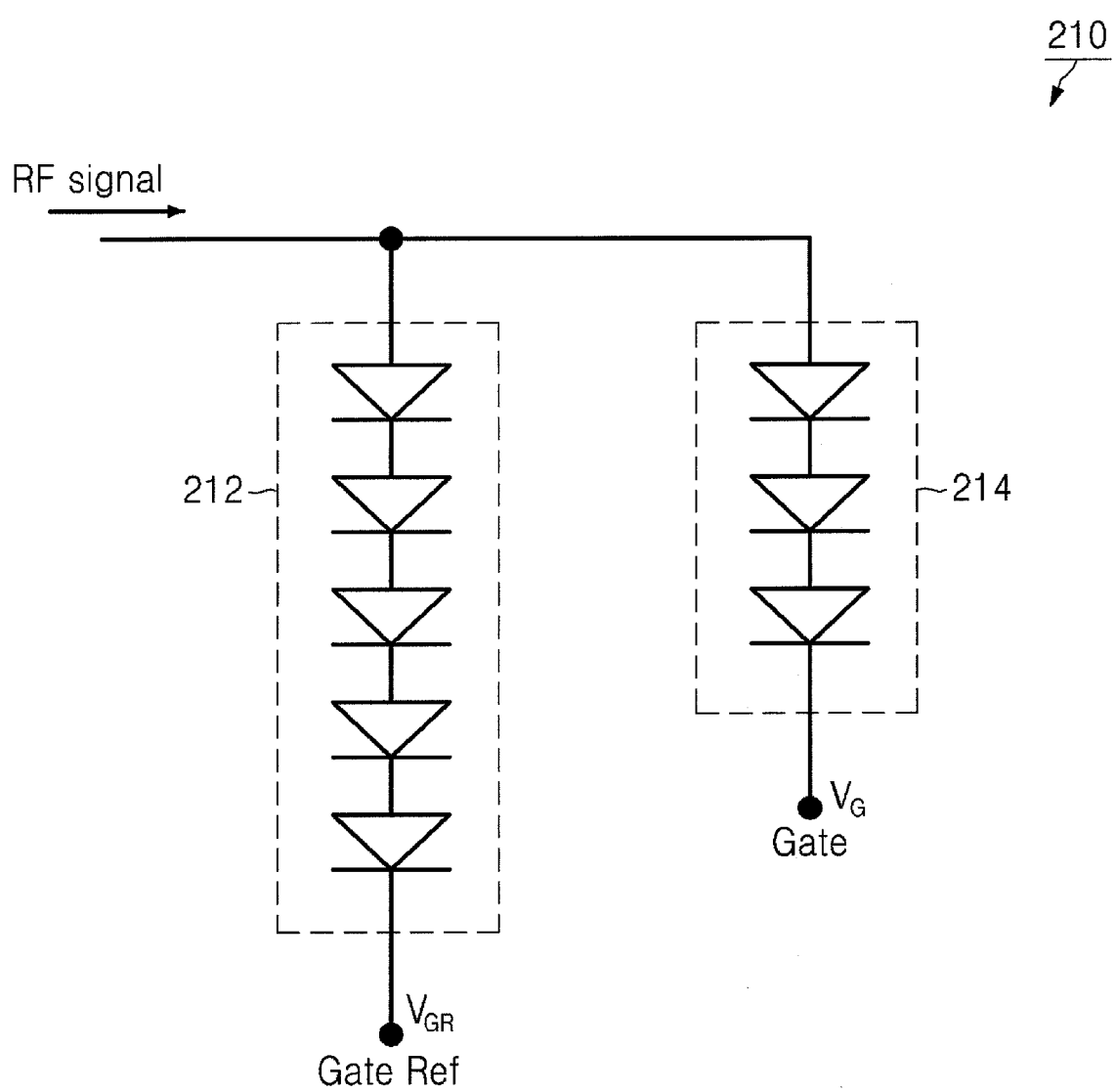
FIG. 3 is a circuit diagram of a string unit according to an exemplary embodiment of the inventive concept.

FIG. 3 is a circuit diagram of the string unit 210, according to an exemplary embodiment of the inventive concept. Referring to FIG. 3, the string unit 210 includes two diode strings 212 and 214, which respectively correspond to the above-described first and second paths. In an exemplary embodiment, the first diode string 212 may have more diodes than the second diode string 214. For example, in the embodiment illustrated in FIG. 3, the first diode string 212 includes five diodes and the second diode string 214 includes three diodes, however the inventive concept is not limited thereto.

The string unit 210 may control the voltage difference between a voltage $V_G$ applied to the gate node Gate and a voltage $V_{GR}$ applied to the gate reference node Gate Ref such that it is constant. For example, the difference between the gate voltage $V_G$ and the gate reference voltage $V_{GR}$ may be maintained constant, for example, at about 1.0 V, regardless of the change in distance between a transmitter and a receiver or a reader and a tag or card. The string unit 210 may include the two diode strings 212 and 214, as illustrated in FIG. 3, but the string unit 210 is not limited thereto. For example, the string unit 210 may be implemented by a different circuit (e.g., a circuit including a rectifier and a level converter) which divides the RF signal into two paths and generates voltage signals having different levels.

Referring back to FIG. 2, the first charge storage device 220 and the second charge storage device 230 each may include a capacitor. In an exemplary embodiment, capacitance C1 of the first charge storage device 220 may be greater than capacitance C2 of the second charge storage device 230. For example, the capacitance C1 may be 16 pF and the capacitance C2 may be 1 pF, but the inventive concept is not limited thereto.

In a non-pause period of the RF signal, the difference between the gate voltage $V_G$ and the gate reference voltage $V_{GR}$ is maintained constant, for example, at about 1.0 V. In a pause period of the RF signal, the level of the gate reference voltage $V_{GR}$ is maintained within a predetermined range due to the higher capacitance C1 of the first charge storage device 220, while the level of the gate voltage $V_G$ drops due to the smaller capacitance C2 of the second charge storage device 230. When the pause period ends, the gate voltage $V_G$, whose level has dropped, returns to the original level, and therefore, the constant difference between the gate voltage $V_G$ and the gate reference voltage $V_{GR}$ is retained.

In an exemplary embodiment, the first current controller 240 and the second current controller 250 are connected to the gate reference node Gate Ref and the gate node Gate respectively, and have arbitrary bias current values I1 and I2 which can be separately controlled. Accordingly, diode strings corresponding to various types of communication modes and speeds can be utilized.

In an exemplary embodiment, the pause data detector 260 receives the gate voltage $V_G$ and the gate reference voltage $V_{GR}$, detects a pause period, and outputs received pause data Rx Pause_data using the pause period.

Figure 4:
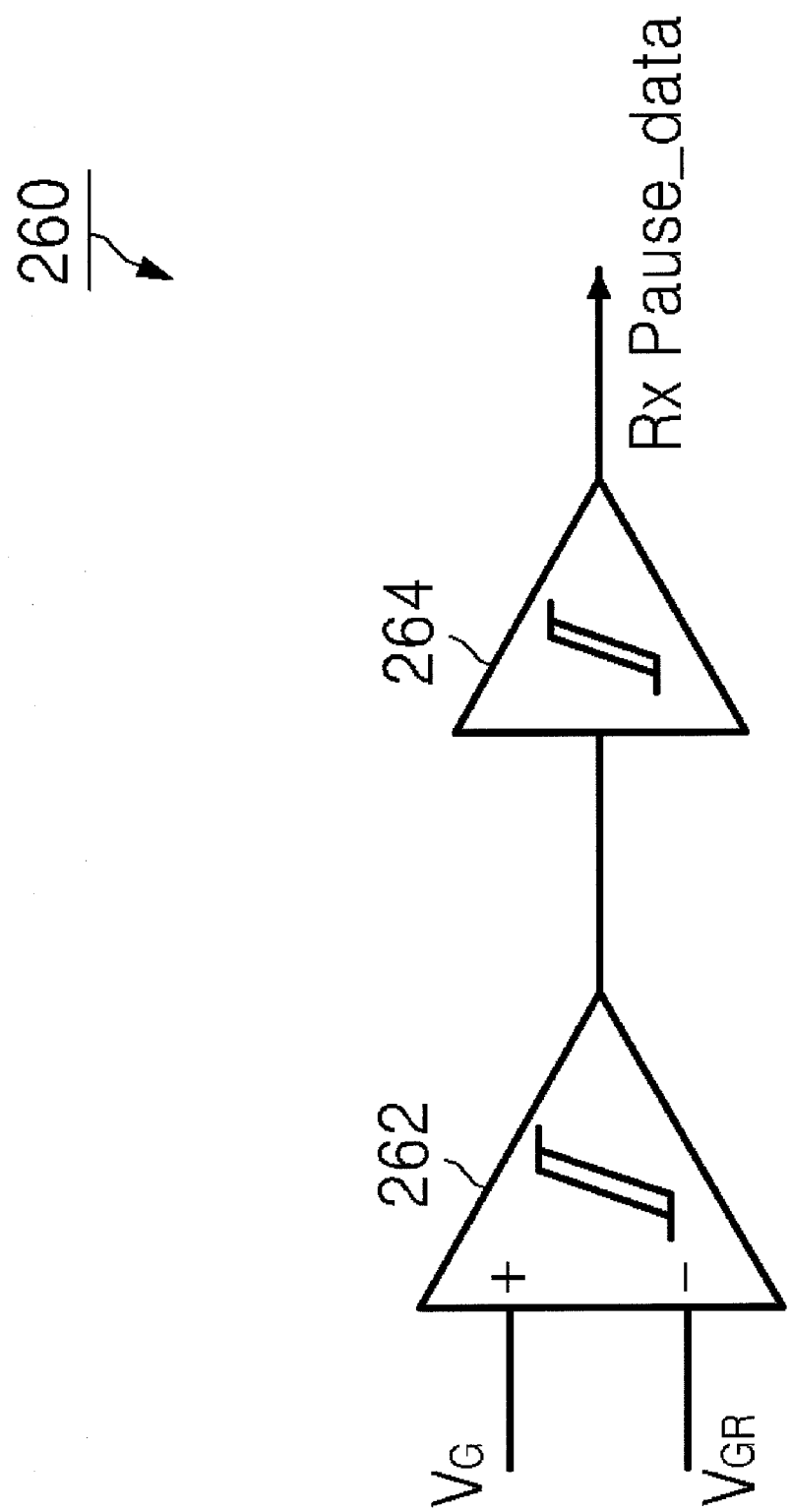
FIG. 4 is a block diagram of a pause data detector according to an exemplary embodiment of the inventive concept.

FIG. 4 is a block diagram of the pause data detector 260 according to an exemplary embodiment of the inventive concept. Referring to FIG. 4, the pause data detector 260 may include a comparator 262 and a filter 264.

The comparator 262 detects a pause period by comparing the gate voltage $V_G$, received through a positive input terminal, with the gate reference voltage $V_{GR}$, received through a negative input terminal. When the pause period starts and ends, a crossing occurs between a positive input voltage (e.g., $V_G$) and a negative input voltage (e.g., $V_{GR}$). The comparator 262 uses this crossing to detect the pause period. For example, when a normal RF signal is received before the pause period, the gate voltage $V_G$ is higher than the gate reference voltage $V_{GR}$. Accordingly, the comparator 262 generates an output at a high level. When the pause period starts, the gate voltage $V_G$ decreases to a level below the gate reference voltage $V_{GR}$, and therefore, the output of the comparator 262 switches to a low level. When the pause period ends, the gate voltage $V_G$ returns to a level higher than the gate reference voltage $V_{GR}$, and therefore, the output of the comparator 262 switches back to the high level.

In an exemplary embodiment, the comparator 262 may have a hysteresis characteristic and may eliminate noise occurring due to AC components remaining in the gate voltage $V_G$ and the gate reference voltage $V_{GR}$, which are input to the comparator 262. The comparator 262 determines that the pause period has started when the gate voltage $V_G$ decreases by at least a predetermined level below the gate reference voltage $V_{GR}$ and determines that the pause period has ended when the gate voltage $V_G$ increases by at least a predetermined level above the gate reference voltage $V_{GR}$, thereby eliminating noise occurring when AC waveforms cross each other. The filter 264 may be, for example, a Schmitt trigger having a hysteresis characteristic. The filter 264 eliminates noise on the output of the comparator 262. The filter 264 may form a single filtering function/execution unit together with the comparator 262. Thus, the pause data detector 260 can generate a more reliable output.

Figure 5:
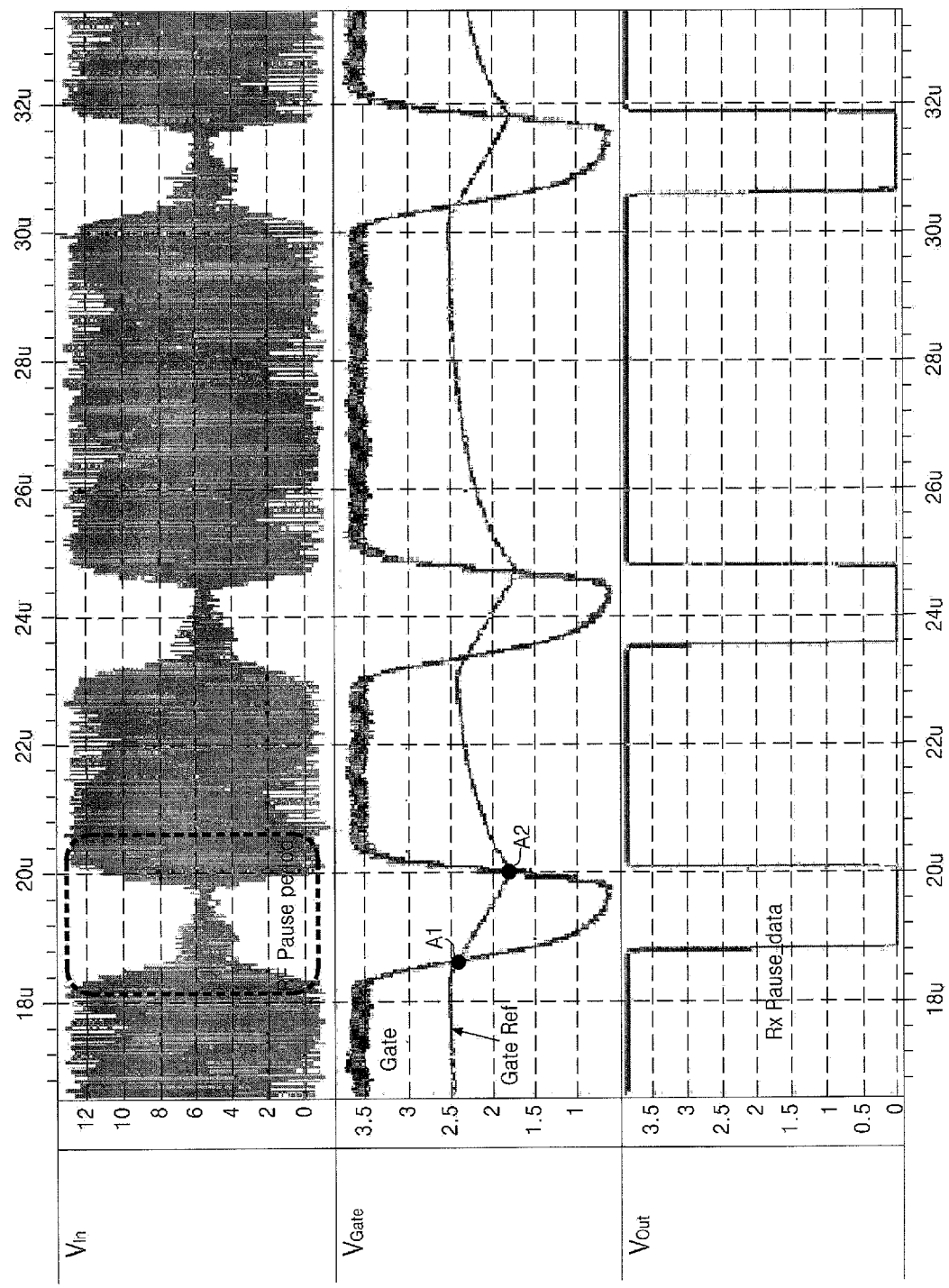
FIG. 5 is a graph showing the result of simulating the operations of an apparatus for type-A demodulation according to an exemplary embodiment of the inventive concept.

FIG. 5 is a graph showing the result of simulating the operations of the apparatus 200 for type-A demodulation, according to an exemplary embodiment of the inventive concept. Referring to FIG. 5, upon receiving an RF signal, the voltage difference between the gate voltage $V_G$ and the gate reference voltage $V_{GR}$ is maintained constant by the string unit 210. When a pause period in the RF signal starts, the gate voltage $V_G$ is dropped by the second charge storage device 230, which has a smaller capacitance C2 than the first charge storage device 220. As a result, the gate voltage $V_G$ crosses the gate reference voltage $V_{GR}$, which has a voltage level maintained by the first charge storage device 220, which has the greater capacitance C1. Thus, at a point A1, the gate voltage $V_G$ decreases below the gate reference voltage $V_{GR}$. When the pause period ends, the gate voltage $V_G$ increases to its original level and crosses the gate reference voltage $V_{GR}$ at a point A2. The pause data detector 260 detects and filters the points A1 and A2, thereby outputting the received pause data Rx Pause_data of a complete square wave falling at the point A1 and rising at the point A2.

Figure 6:
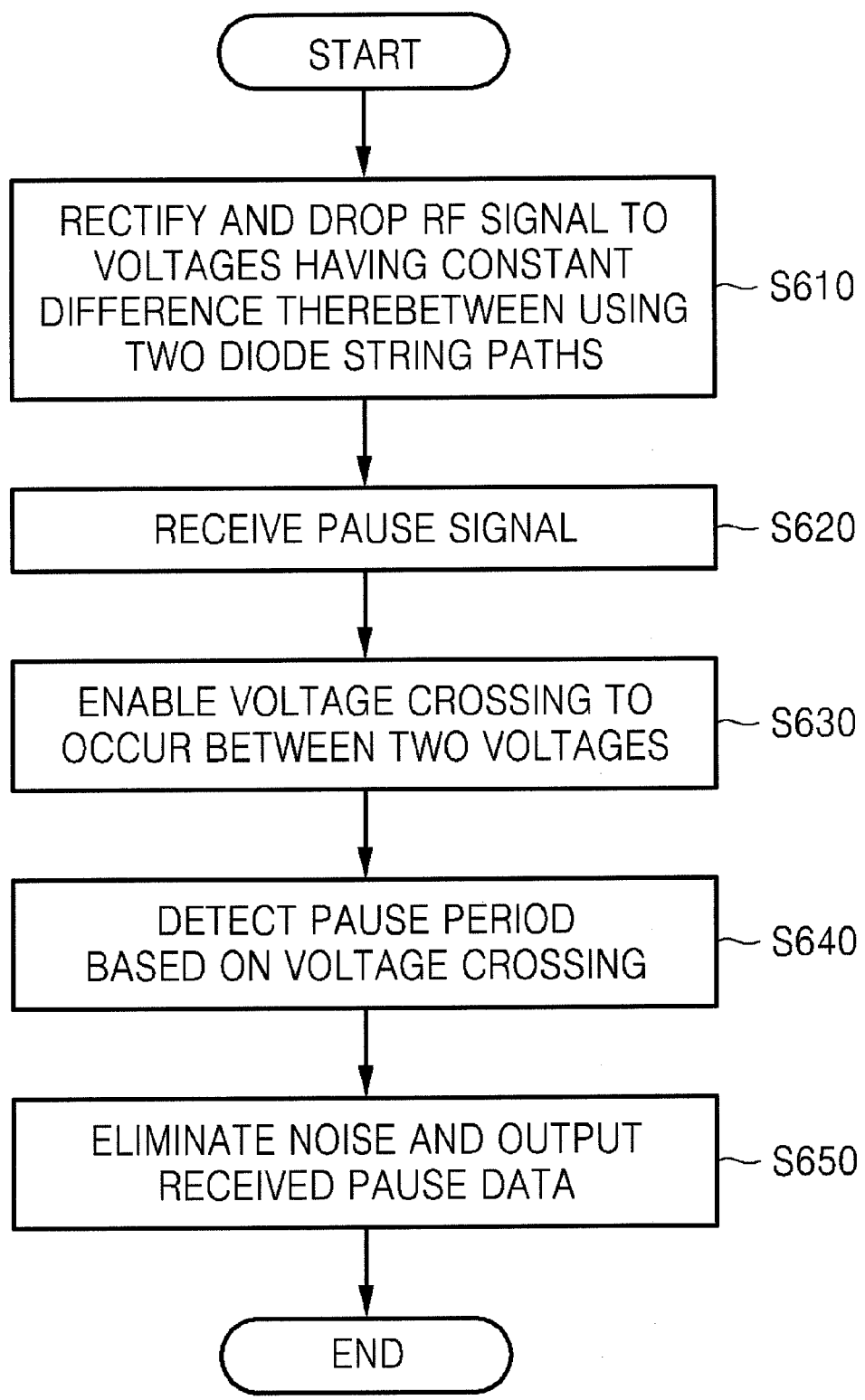
FIG. 6 is a flowchart of a type-A demodulation method according to an exemplary embodiment of the inventive concept.

FIG. 6 is a flowchart of a type-A demodulation method according to an exemplary embodiment of the inventive concept. Referring to FIG. 6, the voltage of an RF signal received through an antenna is rectified and dropped to a first voltage and a second voltage, wherein the voltage difference between the two voltages remains constant as a result of the two diode string paths in operation 5610. Like the first and second diode strings 212 and 214 (FIG. 3) of the string unit 210, one of the two diode string paths may include more diodes than the other, such that the difference between the first and second voltages is maintained constant regardless of any changes in an external environment. The first voltage may be the gate reference voltage $V_{GR}$ and the second voltage may be the gate voltage $V_G$.

When a pause signal is received in operation 5620, a voltage level of the first voltage is maintained by a first capacitance and a voltage level of the second voltage is dropped by a second capacitance less than the first capacitance. As a result, the first and second voltages cross each other in operation 5630. For example, as described above, the first capacitance may be 16 pF and the second capacitance may be 1 pF, such that when the voltage of the RF signal drops in a pause period, the level of the first voltage is maintained by the greater first capacitance and the level of the second voltage is dropped by the smaller second capacitance. As a result, voltage crossing occurs.

The first voltage is compared with the second voltage to detect a pause period based on the voltage crossing in operation 5640. As described above, the pause period can be detected based on the crossing between a positive input voltage and a negative input voltage of the comparator 262 (FIG. 4), which occurs when the pause period starts and ends.

In an exemplary embodiment, noise is eliminated from the pause period by filtering having a hysteresis characteristic. The received pause data is then output in operation 5650. For example, when the second voltage decreases by at least a predetermined level below the first voltage, it is determined that the pause period has started. When the second voltage increases by at least a predetermined level above the first voltage, it is determined that the pause period has ended. Noise occurring when AC waveforms cross each other may be eliminated, resulting in the generation of a complete square wave.

FIG. 7 is a block diagram of an integrated circuit (IC) card 700 according to an exemplary embodiment of the inventive concept. Referring to FIG. 7, the IC card 700 may include an antenna 710, a demodulator 720, a controller 730, and a storage unit 740.

The antenna 710 receives an RF signal from a nearby transmitter.

The demodulator 720 performs type-A demodulation. For example, the demodulator 720 may divide the RF signal received through the antenna 710 into two paths, and may rectify and drop the voltage on each path so that the voltage difference between the two voltages at the respective two paths remains constant. When a pause period starts, the demodulator 720 keeps a lower voltage (e.g., a first voltage) from decreasing below a predetermined level and drops a higher voltage (e.g., a second voltage) below the first voltage, such that voltage crossing occurs. When the pause period ends, the demodulator 720 returns the second voltage to the original level, once again causing voltage crossing occurs. The demodulator 720 may further compare the voltages, detect the pause period based on the voltage crossing, and output received pause data based on the pause period. The demodulator 720 may further eliminate noise from the pause period using filtering having a hysteresis characteristic before outputting the pause period as the received pause data. In an exemplary embodiment, the demodulator 720 may be the apparatus 200 for type-A demodulation illustrated in FIG. 2.

The storage unit 740 stores the received pause data, information about a card holder and/or unique card information (e.g., card identification information). The storage unit 740 may include either or both of a volatile memory and a non-volatile memory and may be implemented by an erasable programmable read-only memory (EPROM) or electrically erasable programmable read-only memory (EEPROM).

The controller 730 controls the RF signal reception of the antenna 710, the demodulation of the demodulator 720, and the data storing of the storage unit 740 in association with the other elements, (i.e., the antenna 710, the demodulator 720, and the storage unit 740).

According to an exemplary embodiment of the inventive concept, two voltages having a constant difference are obtained by rectifying and dropping a received signal using two diode string paths, respectively having different numbers of diodes. The two voltages are used as input voltages of a comparator. Distortion occurring due to change in distance between a transmitter and a receiver is prevented when a pause period is detected in the received signal by the comparator. Bias currents of the two diode string paths may be controlled according to external factors, such as communication speed, such that the pause period is easily detected, even in high-speed communication.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A type-A demodulator, comprising:
a first rectifier configured to rectify a radio frequency (RF) signal received through an antenna and output a first voltage;
a second rectifier configured to rectify the RF signal received through the antenna and output a second voltage having a different voltage level than the first voltage; and
a pause data detector configured to compare the first voltage with the second voltage and to detect received pause data.

2. The apparatus of claim 1, further comprising:
a first charge storage device connected to the first rectifier; and
a second charge storage device connected to the second rectifier and having less capacitance than the first charge storage device.

3. The apparatus of claim 2, wherein a capacitance of each of the first and second charge storage devices is set variably.

4. The apparatus of claim 1, wherein the first rectifier comprises a first diode string comprising a plurality of diodes and the second rectifier comprises a second diode string comprising a less number of diodes than the first diode string.

5. The apparatus of claim 1, wherein the pause data detector comprises a comparator configured to receive the first voltage and the second voltage as a positive input voltage and a negative input voltage, respectively, and detect a pause period based on a first voltage crossing between the first and second voltages occurring when the pause period starts and a second voltage crossing between the first and second voltages occurring when the pause period ends.

6. The apparatus of claim 1, wherein the pause data detector further comprises a filter configured to eliminate noise on an output of the comparator.

7. The apparatus of claim 6, wherein the filter is a Schmitt trigger having a hysteresis characteristic.

8. The apparatus of claim 1, further comprising:
a first current controller configured to induce a voltage drop of the first voltage; and
a second current controller configured to induce a voltage drop of the second voltage.

9. The apparatus of claim 8, wherein a current value of each of the first and second current controllers is set variably.

10. The apparatus of claim 2, wherein the first and second charge storage devices comprise a capacitor.

11. The apparatus of claim 1, wherein a voltage difference between the first voltage and the second voltage remains constant.

12. The apparatus of claim 1, wherein the first and second rectifiers further comprise a level converter.

13. The apparatus of claim 5, wherein the comparator generates an output at a high level during a non-pause period and an output at a low level during a pause period.

14. The apparatus of claim 5, wherein the comparator determines that the pause period has started upon the first voltage decreasing by at least a predetermined level below the second voltage and determines that the pause period has ended upon the first voltage increasing by at least a predetermined level above the second voltage.

15. An integrated circuit (IC) card, comprising:

an antenna configured to receive a radio frequency (RF) signal from a transmitter;

a demodulator configured to rectify the RF signal through two rectifiers, output a first voltage and a second voltage, respectively having different voltage levels, detect a pause period based on a first and second voltage crossing between the first and second voltages, wherein the first voltage crossing occurs when the pause period starts and the second voltage crossing occurs when the pause period ends, and output received pause data;

a storage unit configured to store the received pause data; and a controller configured to control the antenna to receive the RF signal, the demodulator to perform demodulation, and the storage unit to store the pause data.

16. The IC card of claim 15, wherein the demodulator eliminates noise from the pause period using filtering having a hysteresis characteristic and outputs the pause period as the received pause data.

17. The IC card of claim 15, wherein the storage unit comprises at least one of a volatile memory and a non-volatile memory.

18. A type-A demodulation method, comprising:

rectifying an RF signal received through an antenna to a first voltage and a second voltage, respectively having different voltage levels; and detecting a pause period in the RF signal based on a first and second voltage crossing between the first voltage and the second voltage, wherein the first voltage crossing corresponds to a start of the pause period and the second voltage crossing corresponds to an end of the pause period.

19. The type-A demodulation method of claim 18, further comprising:

eliminating noise from the pause period using filtering having a hysteresis characteristic and outputting the pause period as received pause data.

20. The type-A demodulation method of claim 18, wherein the voltage of the RF signal is rectified and dropped through two diode string paths, respectively including a different number of diodes.

* * * * *